United States Patent [19]

Teti, Jr. et al.

[11] 4,089,464
[45] May 16, 1978

[54] INSTRUMENT HOUSING

[75] Inventors: Joseph A. Teti, Jr., Merion; Peter A. Peroni, Pottstown, both of Pa.

[73] Assignee: LaFrance Precision Casting Company, Philadelphia, Pa.

[21] Appl. No.: 728,243

[22] Filed: Sep. 30, 1976

[51] Int. Cl.² ............... B65D 7/00; B65D 25/28; A47B 95/02

[52] U.S. Cl. .................... 220/4 A; 220/4 F; 220/94 R; 224/45 P; 248/471; 16/126; 312/244; 312/264

[58] Field of Search ........... 220/4 R, 4 A, 4 B, 4 E, 220/4 F, 4 C, 8, 75, 76, 94 R, DIG. 25, 3.94; 361/331, 380, 390; 312/244, 264; 174/52 R; 16/126; 224/45 P; 248/471

[56] References Cited

U.S. PATENT DOCUMENTS

| 2,751,760 | 6/1956 | Williams, Jr. | 220/8 X |
| 3,413,050 | 11/1968 | Sommers et al. | 220/4 R X |
| 3,464,586 | 9/1969 | Hitzeroth | 220/94 R |
| 3,687,325 | 8/1972 | Simons | 220/3.94 X |
| 3,734,342 | 5/1973 | Patterson | 220/3.94 |
| 3,872,995 | 3/1975 | Eickhorst | 220/4 R |
| 3,924,775 | 12/1975 | Andreaggi et al. | 220/96 |

OTHER PUBLICATIONS

Electronics, 6/24/76, pp. 42 & 44, New Case Adjusts to Fit Instrument.

Primary Examiner—George E. Lowrance
Assistant Examiner—Steven M. Pollard
Attorney, Agent, or Firm—Connolly and Hutz

[57] ABSTRACT

A molded instrument housing includes a top wall and a bottom wall slidably connected to a pair of opposed side walls or expanders to form a hollow housing with fastening means securing the various walls together by passing through vertical guide members on the side walls. Horizontal flanges are integral with the side walls and the guide members are molded to and extend from the flanges. Each flange includes a vertical opening which renders it adaptable for having a support member secured thereto. A novel handle construction is also provided.

31 Claims, 28 Drawing Figures

INSTRUMENT HOUSING

BACKGROUND OF THE INVENTION

Instruments housings are widely used for various purposes and particularly have countless uses in the electronics field. Such uses include counters, meters, CB radios, testers, oscilloscopes, thermocouples, bridges, etc. From a manufacturing standpoint, it would be very desirable if basic components could be utilized by the manufacturer for assemblying the housings in any one of a wide variety of different sizes and configurations as well as incorporating special equipment that might be required by individual diverse users.

It is known, for example, to manufacture such housings in modular form wherein separate elements comprise the top and bottom members as well as the sides and end panels. It is also well known to incorporate handle structures on the housings which can be locked into various positions for portability and/or maintaining the housing at a particular orientation during use.

Various teachings have been employed in the art for the assembly of such housings. It is well known in the art for example to utilize insert panels as part of the side walls to vary the height for the housing, as exemplified by U.S. Pat. No. 3,687,325 or by a commercial housing known as the Tracewell Enclosure which is described in an April 1974 brochure from Tracewell Enclosures, Inc., of Columbus, Ohio. The Tracewell Enclosure, as well as U.S. Pat. No. 3,284,151, also utilize top and bottom walls having integral perpendicular side extensions which are secured in various manners to separate intermediate side panels. In the Tracewell Enclosure end plates are fit into endless peripheral grooves in the top and bottom and side walls. The concept of interchangeable wall sections is also exemplified in U.S. Pat. No. 1,402,769 wherein the various sides fit or telescope into grooves and then are secured together by screws inserted through one wall for threaded engagement at the other wall. U.S. Pat. No. 1,875,101 exemplifies the expediency of varying the dimension of an electrical housing by the utilization of telescopic side sections. In that patent a pair of face plates or covers are provided each with depending side sections with the side sections of one being telescopically arranged with respect to the other and with the elements locked in place by threaded fasteners. One assembly expediency is practiced commercially for example by JVC America in its portable ratio-TV and by Zero Manufacturing Company with its COMPACT 1 Enclosures where side extensions of the top and bottom covers telescope into slotted side panels so that access could be had to the chassis by withdrawing the top cover with is integral side extensions from the panels.

Based on this state of the art various ramifications would seem obvious and have been used. For example, the dimensional adjustability could be obtained by forming the covers and depending side sections generally identical with each other, as exemplified by U.S. Pat. No. 3,284,151; IBM Technical Disclosure Bulletin, Vol. 18, No. 6 of November 1975; or the Tracewell Enclosure and effecting the adjustability by telescopic relationship of the depending side extensions with the inserts or side panels in view of similar telescopic action in U.S. Pat. No. 1,875,101. The obvious manners of providing such telescopic action could be either by sliding engagement or by inserting one member in a groove of the other, whether the grooves be in the depending side extensions of the covers or in the separate side panels. This would be similar to the aforenoted commercial practices of JVC and Zero where the side extensions on the top and bottom covers slide into grooves or slots in the side panels. The various elements could then be locked together by threaded fasteners. Where lengthy threaded fasteners are utilized it is common to provide hollow guideposts therefore, as exemplified by U.S. Pat. No. 3,209,208 and by the Tracewell Enclosure which has hollow posts integrally mounted on the side panels.

Similarly, various handle structures have been utilized by the prior art. U.S. Pat. No. 3,924,775 for example discloses an instrument housing having an adjustable handle with means provided for selectively locking it in various positions. These means include interfitting splines and recesses on the handle and on a reinforcing rib of the housing for indexing the handle or locking it into selected positions with the unlocking being accomplished by virtue of the resiliency of the handle arms which permits the handle to be axially withdrawn from the housing sockets.

Various other expediences are practiced by the prior art. It is conventional, for example, when utilizing the housings for mounting various circuit boards to provide appropriate vertical posts, grooves or other guides for properly positioning the circuit boards. U.S. Pat. No. 3,311,792, for example, discloses integrally molded ribs or grooves on the housing walls for slidably receiving circuit boards or cards, while the Tracewell Enclosure also has card receiving grooves molded therein.

SUMMARY OF THE INVENTION

An object of this invention is to provide improvements over the various techniques utilized by the prior art in the manufacture and assembly of instrument housings.

A further object of this invention is to provide such an instrument housing made in components parts in such a manner as to maximize its versatility while maintaining a clean appearance.

A still further object of this invention is to provide an instrument housing having an improved handle which may be adjusted without disengagement thereof.

A still further object of this invention is to provide such an instrument housing capable of such features as being nestable or stackable, having interchangeable components as part of the housing which creates different physical sizes and shapes, and having means for accommodating various forms of circuit boards at various locations therein.

In accordance with this invention the instrument housing is of modular structure having a molded top wall, a molded bottom wall and a pair of molded side walls or expanders slidably connected to the top and bottom walls. The expanders have vertical guide members integrally molded thereto through which securing means may be mounted and also have horizontal flanges integral therewith. Holes or openings are provided in the flanges to accommodate various circuit card adapters such as rail adapters or card slide adapters. Vertical adjustability may be achieved by the use of detachable spacers interfitting with the vertical guide member.

In a preferred form of this invention an improved handle structure is utilized which includes spring mounted arms secured in sockets in the expanders in such a manner as to permit selective indexing or positioning of the U-shaped handle without being detached from the housing.

DETAILED DESCRIPTION

Figures 1, 2, 3, 7, 8:
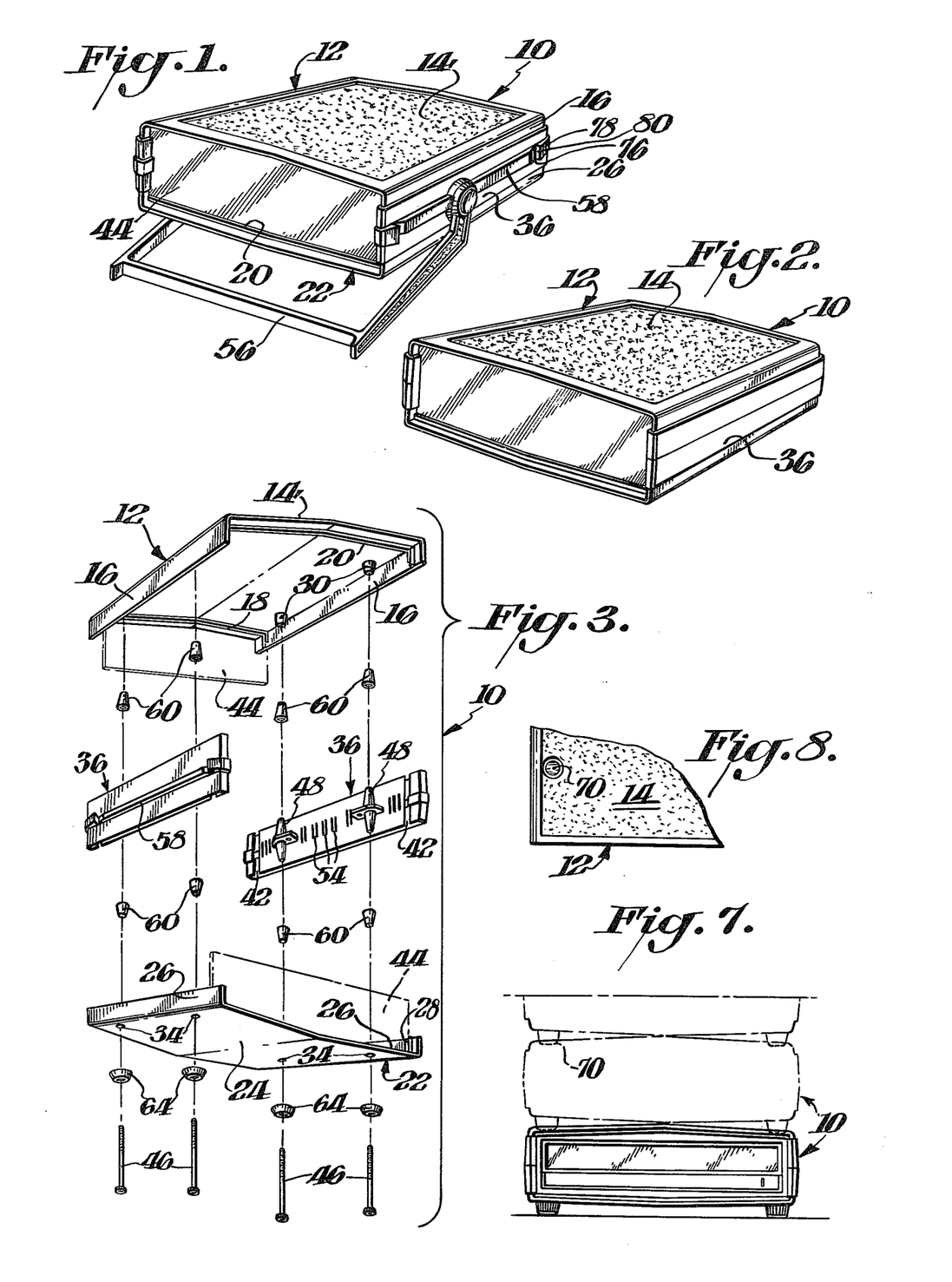
FIG. 1 is a perspective view of an instrument housing in accordance with this invention and including the novel handle structure.
FIG. 2 is a perspective view similar to FIG. 1 of a molded form of instrument housing without the handle structure.
FIG. 3 is a pictorial assembly of the instrument housing shown in FIG. 2.
FIG. 7 is an elevation view of an instrument housing in accordance with this invention and showing in phantom a plurality of similar housings in nested or stacked form.
FIG. 8 is a top plan view of a portion of one of the housings shown in FIG. 7.
Figure 4:
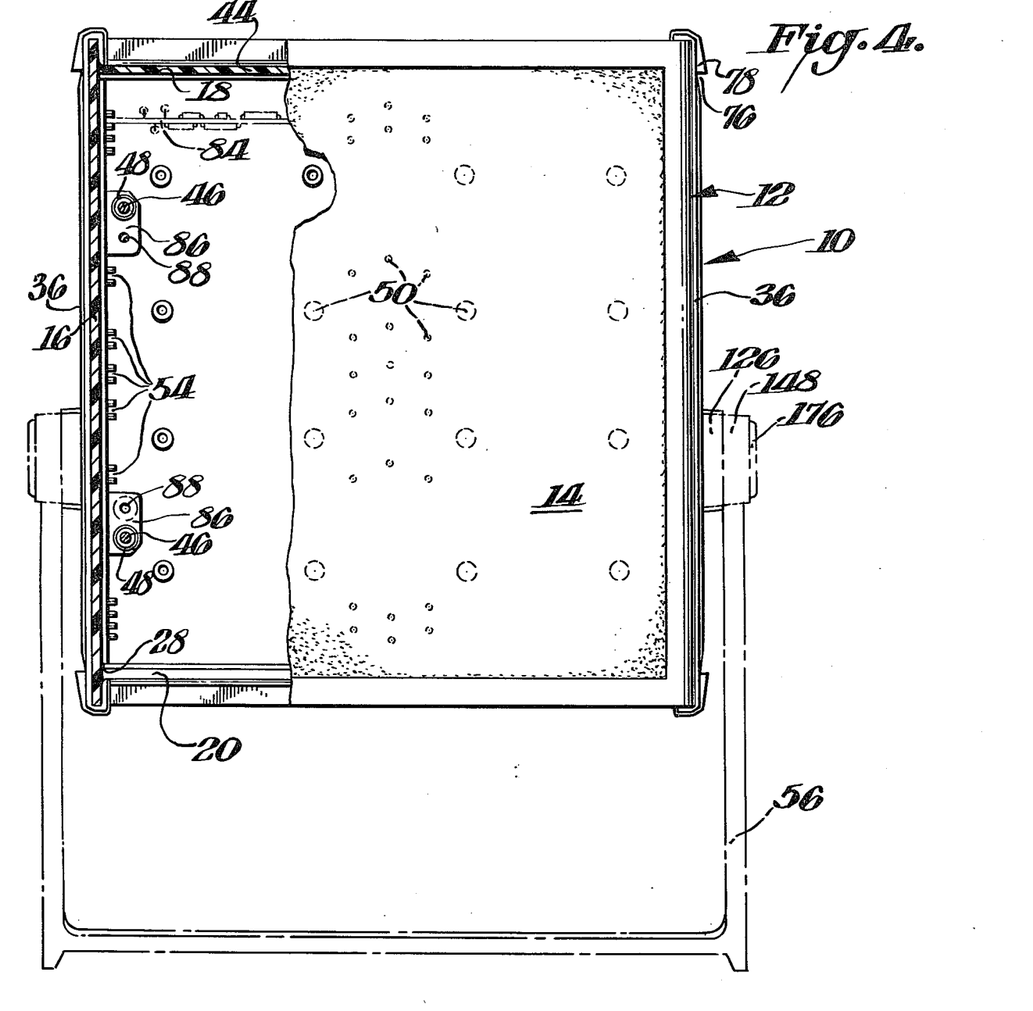
FIG. 4 is a top plan view partly in section of the instrument housing shown in FIG. 1.
Figure 5:
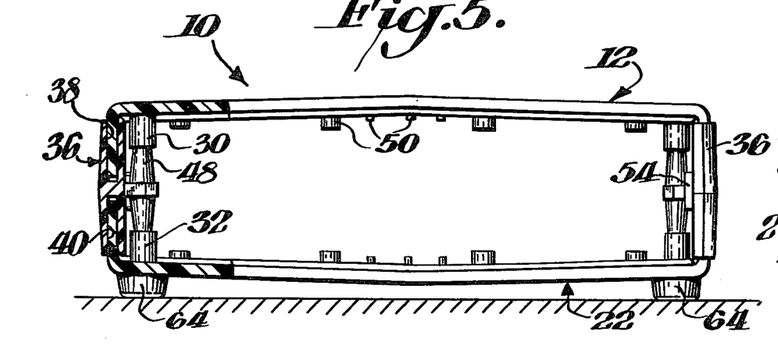
FIG. 5 is a front elevation view partly in section of the instrument housing shown in FIG. 2.

FIG. 3 illustrates the components of the basic instrument housing 10 in accordance with this invention. As indicated therein, a top cover 12 includes an intermediate member 14 having a slight tapered or arcuate configuration and terminating in depending vertical flanges or side extensions 16. A pair of peripheral grooves or slots 18, 20 are provided at the front and back ends by molding spaced projections integral with the top cover. A bottom cover 22 is also provided and is generally of the same shape and configuration as top cover 12 in that the bottom cover 22 includes a slightly bowed intermediate member 24 with upstanding vertical flanges or side extensions 26 and peripheral grooves or slots 28. As later described both bottom cover 22 and top cover 12 are provided with aligned bosses. Bosses 30 in top cover 12 are internally threaded, whereas bosses 32 (FIG. 5) have a smooth hollow interior generally oversize with respect to the diameter of the internally threaded bosses 30. Bosses 32 communicate with openings 34 at the exposed lower surface of bottom cover 22 whereas the exposed upper surface of top cover 12 is imperforate. A pair of expanders or side panels 36 are also provided and are formed H-shaped in cross section (FIG. 5) thus creating a relatively deep upper groove 38 and corresponding lower groove 40 (FIG. 5) for telescopingly receiving flanges or side extensions 16 in upper groove 38 and flanges or side extensions 26 in lower groove 40. A longitudinal slot 42 is formed at each end on the inner surface of each expander 36 for alignment with slots 18, 28, 20 to thus provide endless peripheral slots or grooves into which end plates or panels 44 may be fit. The entire assembly is then secured together by means of threaded fasteners 46 extending through opening 34 and threadably engaging bosses 30. A pair of hollow posts 48 are integrally molded to each expander 36 in alignment with a corresponding set of bosses 30, 32 and the threaded fasteners 46 extending completely through these guide posts 48. The inner surface of both top cover 12 and bottom cover 22 are provided with various lugs or posts 50 and the inner surface of expanders 36 are provided with vertical slots or guides 54 (FIG. 4) for positioning PC cards or various other components. As illustrated in FIGS. 1 and 4 an adjustable handle 56 may also, if desired, be provided at any suitable location such as on the side expanders 36 for disposing the housing 10 in various inclined orientations and for carrying purposes. The sides of the housing may also have reinforcing ribs 58 adapted for receiving a shroud as later described and the handle is preferably attached along the reinforcing ribs.

Figure 6:
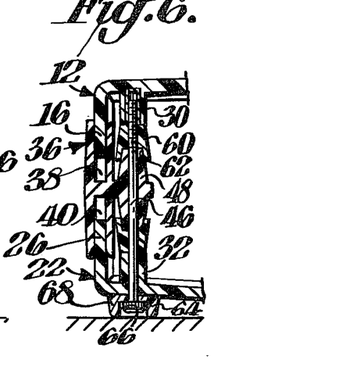
FIG. 6 is a cross-sectional view in elevation of a portion of the instrument housing shown in FIG. 3 in its assembled condition.

In accordance with this invention detachable spacers 60 are provided for permitting the height of the instrument housing or casing 10 to be varied and then locked in place in a stable manner. FIG. 6, for example, illustrates the details of each such spacer 60. As illustrated therein, the spacer is frusto-conically shaped having an axial opening extending completely therethrough. The wider end of each spacer is provided with a recess 62 for fitting on the slightly tapered posts 48 and the threaded fasteners 46 thus extending through bosses 30, 32, posts 48 and spacers 60, 60. Any suitable number and dimension of spacer may be utilized in accordance with the needs and requirements of the ultimate user. The housing, however, permits interchangeable parts to be used to form a basic structure having components which may be varied or interchanged and which are adapted to incorporate such features as spacers 60 for facilitating obtaining any number of a wide variety of sizes. Obviously, a change in the height of the housing would require an appropriately sized end panel 44.

In accordance with a further aspect of this invention a plurality of detachable feet are provided one for each threaded fastener 46. The feet 64 are likewise frusto-conically shaped and include an axial opening extending completely therethrough with an inner recess 66. Fastener 46 is inserted through the opening during assembly of the housing until the head of the fastener contacts the upper wall 68 of feet 64 and the housing is assembled as previously described. The provision of feet 64 orientations and for carrying purposes. The sides of the housing may also have reinforcing ribs 58 adapted for receiving a shroud as later described and the handle is preferably attached along the reinforcing ribs.

In accordance with this invention detachable spacers 60 are provided for permitting the height of the instrument housing or casing 10 to be varied and then locked in place in a stable manner. FIG. 6, for example, illustrates the details of each such spacer 60. As illustrated therein the spacer is frusto-conically shaped having an axial opening extending completely therethrough. The wider end of each spacer is provided with a recess 62 for fitting on the slightly tapered posts 48 and the threaded fasteners 46 thus extend through bosses 30, 32, posts 48 and spacers 60, 60. Any suitable number and dimension of spacer may be utilized in accordance with the needs and requirements of the ultimate user. The housing, however, permits interchangeable parts to be used to form a basic structure having components which may be varied or interchanged and which are adapted to incorporate such features as spacers 60 for facilitating obtaining any number of a wide variety of sizes. Obviously, a change in the height of the housing would require an appropriately sized end panel 44.

In accordance with a further aspect of this invention a plurality of detachable feet are provided one for each threaded fastener 46. The feet 64 are likewise frusto-conically shaped and include an axial opening extending completely therethrough with an inner recess 66. Fastener 46 is inserted through the opening during assembly of the housing until the head of the fastener contacts the upper wall 68 of feet 64 and the housing is assembled as previously described. The provision of feet 64 results in a number of advantages. For example, the recessed feet completely shield the otherwise unsightly threaded fasteners 46. Moreover, the feet provide stability for the housing which otherwise would not be stable where a curved configuration is used as is frequently desired by ultimate users. There is yet another advantage of feet 64 in that the feet permit a plurality of such housings to be stacked atop each other with the feet extending below the lowest point of bottom cover 22 and terminating in the same horizontal plane in such a manner that the feet of one housing can rest on the curved upper surface of another housing and provide a stable stacking. This is particularly useful in storing and transporting such housings. The stability and transportability still might be enhanced further by providing slight recesses or depressions 70 (FIG. 8) in the upper surface of each top cover 12 for accommodating feet 64 whereupon a plurality of such housings 10 may be mounted atop each other in more of a nested fashion as illustrated in FIG. 7. To effectuate this concept each recess 70 would be disposed in line with and above a corresponding foot 64.

Figure 11:
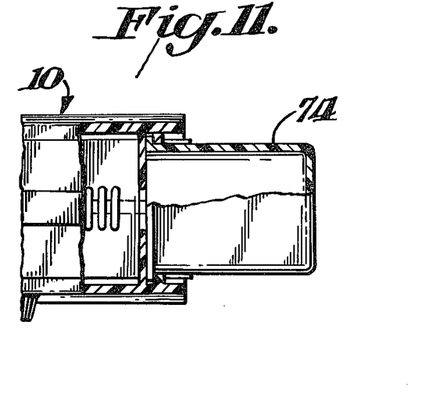
FIG. 11 is a side elevation view partly in section of a portion of an instrument housing in accordance with this invention having an end extension secured thereto.
Figure 12:
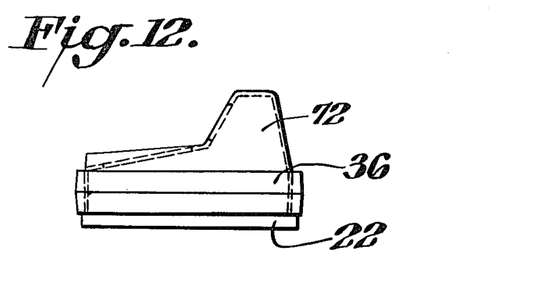
FIG. 12 is a side elevation view of a modified form of instrument housing in accordance with this invention with a keyboard top member.
Figure 13:
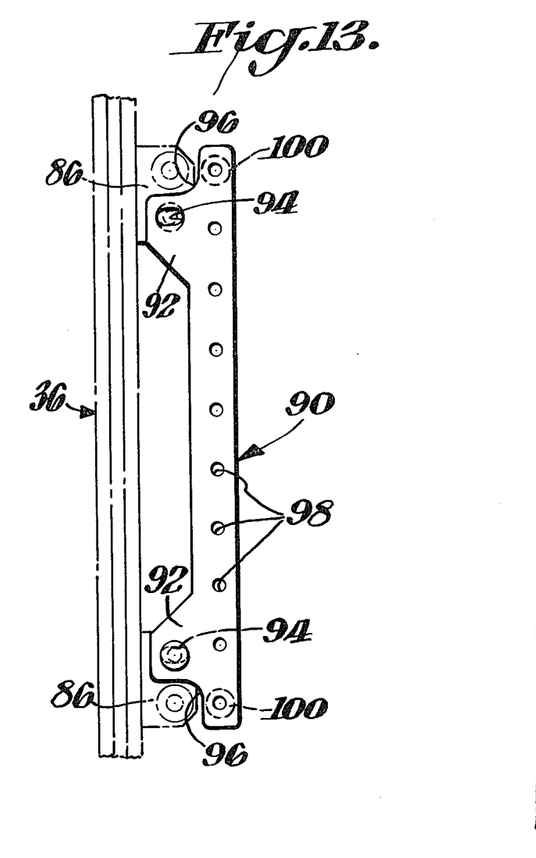
FIG. 13 is a top plan view of a portion of instrument housing in accordance with this invention having a rail adapter secured thereon.

As previously indicated, expander 36 may be provided with handles or the handles may be completely omitted. Similarly, the elements of housing 10 may be used in such a manner that modified forms of these basic elements could be interchangeably used in assemblying various different types of housings. This interchangeability of the housing components permits a wide variety of modifications and different styles to be utilized from the same basic structure. For example, FIG. 12 illustrates a form of the invention wherein the top cover 72 is shaped as a keyboard unit which could have transparent sections, screens, etc., as well as providing additional space for accommodating various components in accordance with the user's needs or desires. Similarly, the end panels may be in the form of hollow extensions 74 as illustrated in FIG. 11 to extend the interior of the housing for accommodating various components. Further, various types of customized panels may be used for any of the wall components (i.e. top cover, bottom cover, expanders, and front and back panels) in accordance with user's desires. Not only is the housing capable of height and length expansion but by proper modification of the top and bottom covers, width expansion is also possible. For example, the top and bottom covers may each be made of a pair or any number of interfitting components which may be appropriately separated to receive inserts which would expand the overall width thereof and these units would still telescope into the slotted expanders.

It is to be understood that although this invention is particularly described in connection with slotted expanders, various other equivalent means known to the prior art may be used. Thus the telescopic action may take place by having the expanders or side panels slide on the flanges or side extensions of the top and bottom cover members or the sliding action may take place in either the side extensions or the expanders which are then locked in place by suitable connectors.

Figure 10:
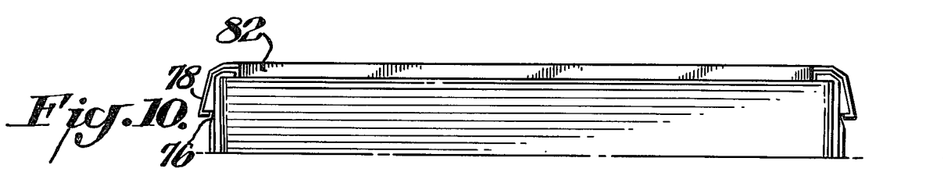
FIG. 10 is a top plan view of a portion of an instrument housing having a protective shroud mounted thereon.

As previously described, a reinforcing rib 58 is provided along opposite sides of housing 10, namely, along the longitudinal center line of expanders 36. The ribs 58 preferably taper inwardly as indicated by reference numeral 76 (FIGS. 1 and 10) a slight distance from each edge and a tapered abutment 78 is molded toward the recess 76 terminating in a vertical face 80. The vertical face 80 is utilized for snapping or otherwise mounting a detachable shroud 82 (FIG. 10) to protect the front and/or rear of the housing particularly where delicate instruments are mounted thereon as is customary in the prior art. Such shrouds are generally used where the housing is frequently moved or portable and the housing would have a handle. In other cases where a handle is omitted, the expanders 36 may likewise omit the reinforcing rib and shroud mounts as illustrated in FIG. 2. If desired, of course, the expanders 36 may simply omit the handle receiving structure and still be capable of receiving shrouds as in FIG. 3.

Figure 9:
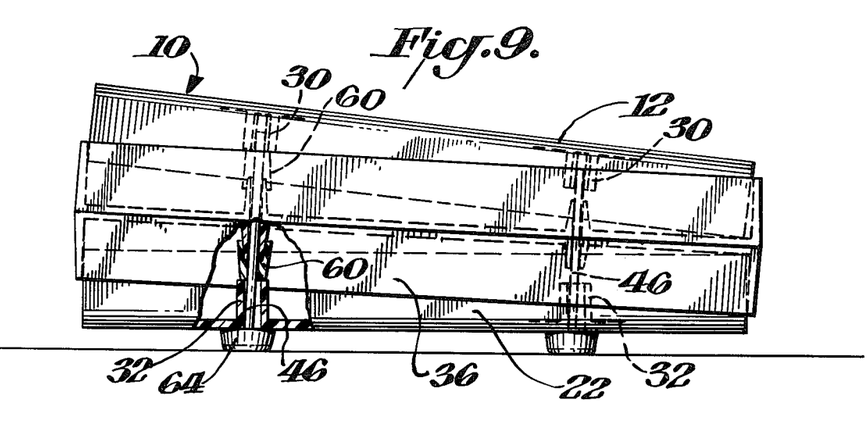
FIG. 9 is a side elevation view partly in section of a further instrument housing in accordance with this invention.

FIG. 9 illustrates a further ramification of this invention. As indicated therein, a different aesthetic affect is achieved as well as a change in the overall dimension of the housing by expanding one end thereof more than the other. For example, in the illustrated embodiment spacers 60 are provided at the front end but not at the rear end of expanders 36. The openings in bosses 32, spacers 60 and posts 48 are made oversize with respect to the diameter of fasteners 46 so that the fasteners may still extend through these openings at an angle and still make threaded engagement with upper bosses 30.

As previously indicated, various formations such as posts 50 (some of which may be apertured) and slots 54 are provided in a conventional manner for accommodating conventional electronics equipment such as circuit cards. For example, FIG. 4 illustrates PC cards 84 mounted in pairs of such slots 54. In accordance with this invention the adaptability for receiving such electrical components is vastly improved by incorporating horizontal flanges 86 on the inner surface of expanders 36. Each such flange 86 includes an opening 88 preferably extending completely therethrough. Flanges 86 are disposed about midway the height of each expander in the area of posts 46 to thus enhance the stability of posts 46 as well as serving the dual function of accommodating electrical components.

Figure 14:
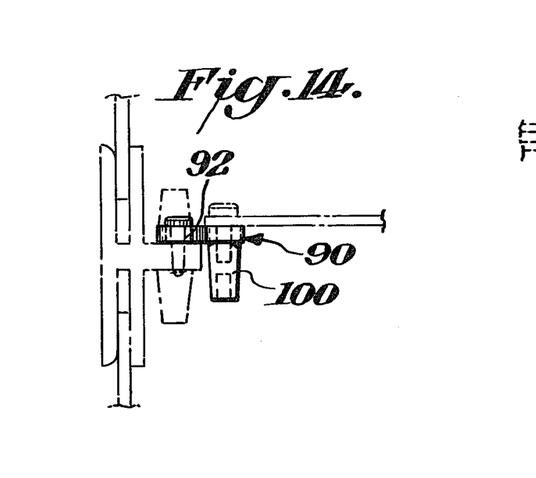
FIG. 14 is an elevation view of the rail adapter arrangement shown in FIG. 13.

The flanges 86 and their apertures 88 may be utilized in a number of different manners. FIG. 14 illustrates one such use where rail adapters 90 are mounted in housing 10. The rail adapters 90 may take various forms but preferably each includes, at each end of the horizontal bridging member, an extension 92 which fits on flange 86 and which includes slots 94 disposed over apertures 88 so that a single rail adapter spans or bridges a pair of flanges 86. A cut-out portion 96 is provided at each end of rail adapter for accommodating posts 46. A series of aligned holes 98 are provided along one edge of rail adapter 90. Downwardly extending ports 100 (FIG. 14) having axial apertures therethrough are provided on the lower surface of rail adapter 90 in line with the end holes 98. A pair of identical but inverted rail adapters are provided in the housing 10, one rail adapter being mounted on each expander 36 and are secured in place by, for example, screws extending through aligned holes 94, 88. The pairs of rail adapters and their various apertures may be used to accommodate and mount various types PC cards or other electrical components. In particular the rail adapters 90 may mount various types of chassis.

Where housing 10 is made elongated plural sets of flanges 86 may be provided on each expander 36 for receiving plural sets of rail adapters 90 or plural sets of later described card slide adapters 102.

Figure 15:
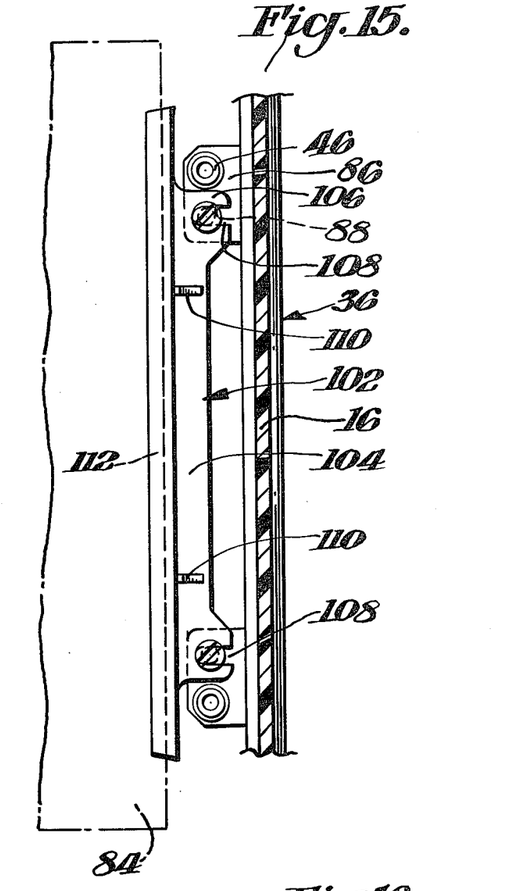
FIG. 15 is a top plan view of a portion of instrument housing having a card slide adapter secured thereon in accordance with this invention.
Figure 16:
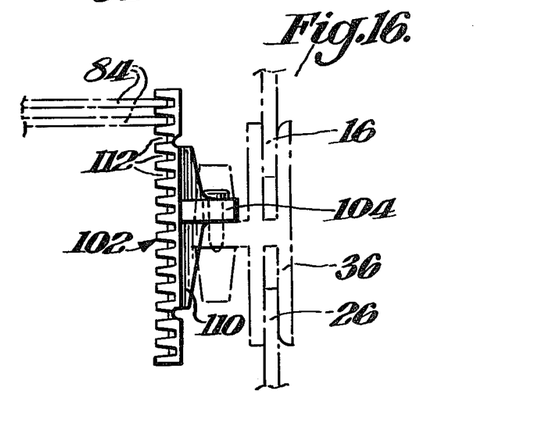
FIG. 16 is an elevation view of the card slide adapter mounting of FIG. 15.

FIGS. 15 and 16 illustrate how the same flange 86 which accommodates a rail adapter may alternatively be utilized for mounting card slide adapters 102. Each such card slide adapter includes a horizontal bridging member 104 which rests upon and spans the pair of flanges 86 on each expander 36 and includes integral extensions 106 having slots 108 formed wherein for positioning over holes 88 in flanges 86 whereby the card slide adapters 102 may be mounted by screws or other means to the expanders 36. Each card slide adapter 102 is identical to the other with one being inverted from the other so that PC cards may be slid into the corresponding slots from the pair of card slide adapters. Obviously, the structural details of the card slide adapter may take various forms without departing from the concepts of this invention. Similarly, the various support elements may be used in combination with each other. Thus, for example, a horizontal card may be inserted in the card slide adapters having components associated with components on a juxtaposed vertical card in slots 54.

Figures 17, 18, 22:
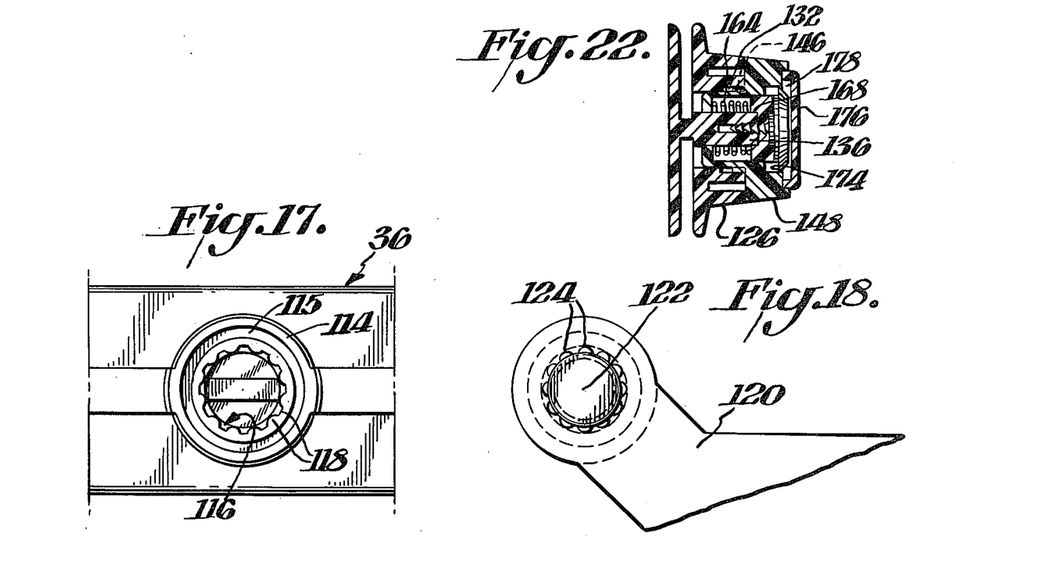
FIG. 17 is a slide elevation view of a portion of instrument housing illustrating a handle receiving socket.
FIG. 18 is a side elevation view showing the structure of a handle adapted for securement to the socket of FIG. 17.
FIGS. 22 and 22A are side elevation views partly in section showing the handle structures of FIGS. 19-21 in different phases of operation.
Figures 19, 20:
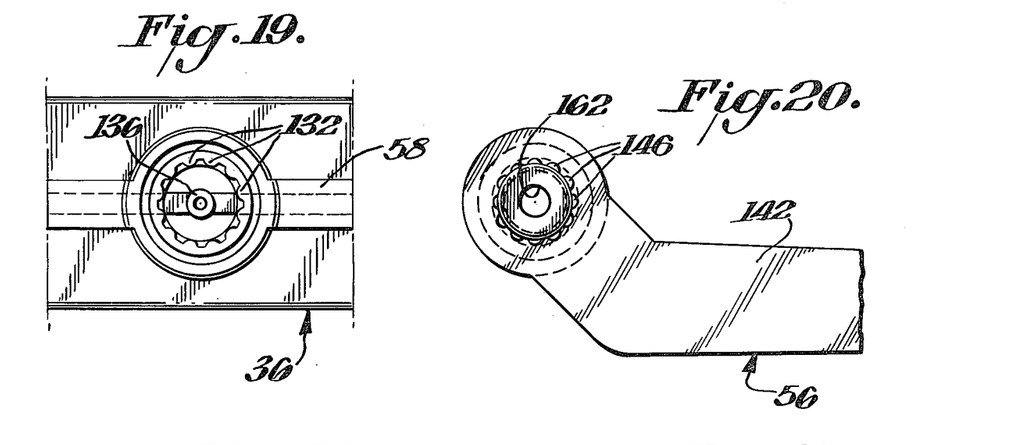
FIG. 19 is a side elevation view of a portion of an instrument housing in accordance with this invention showing a handle receiving socket.
FIG. 20 is a side elevation view of a handle adapted for securement of the socket of FIG. 19.
Figure 23:
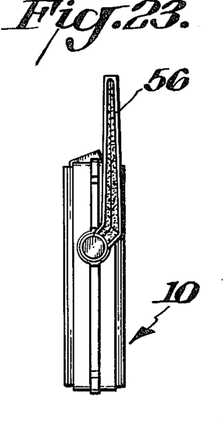
FIG. 23 is a side elevation view of an instrument housing illustrating the handle in its carrying position.

As previously discussed housing 10 may include a handle 56. Handle 56 may take various forms. FIGS. 17-18 for example illustrate a construction of the type generally disclosed in U.S. Pat. No. 3,924,775. As illustrated in FIG. 17, each expander 36 includes an outwardly extending boss 114 having an annular recess 115 which defines a socket 116. Socket 116 has a hollow interior in undulated form with a number of recesses or ratchets 118. The handle is made generally U-shape of resilient material and terminates in a pair of legs 120 each of which has an inwardly extending projection or tongue 122 at its free end thereof with an undulated or ratchet surface 124 formed thereon shaped in a complementary manner to ratchet formulation 118 on expander 36. In this manner the tongue 122 of the handle is inserted into the socket and manipulated or rotated until the ratchet formations 118, 124 interlock to hold the handle in place. The resiliency of the U-shaped handle material permits the handle to be removed and/or the orientation thereof to be altered by simply spreading the legs 120 apart to disengage the ratchet formations 118, 124. The handle would then be positioned to be utilized as a handle having various adjustable positions and it is thus possible to mount the housing 10 at various inclined positions such as illustrated in FIG. 1 wherein the bight of the handle acts as a support for the housing. Similarly, by disposing the handle 56 generally longitudinally in line with the housing 10 as illustrated in FIG. 23 the handle may be used as a handle for its portability.

Figures 21, 22A:
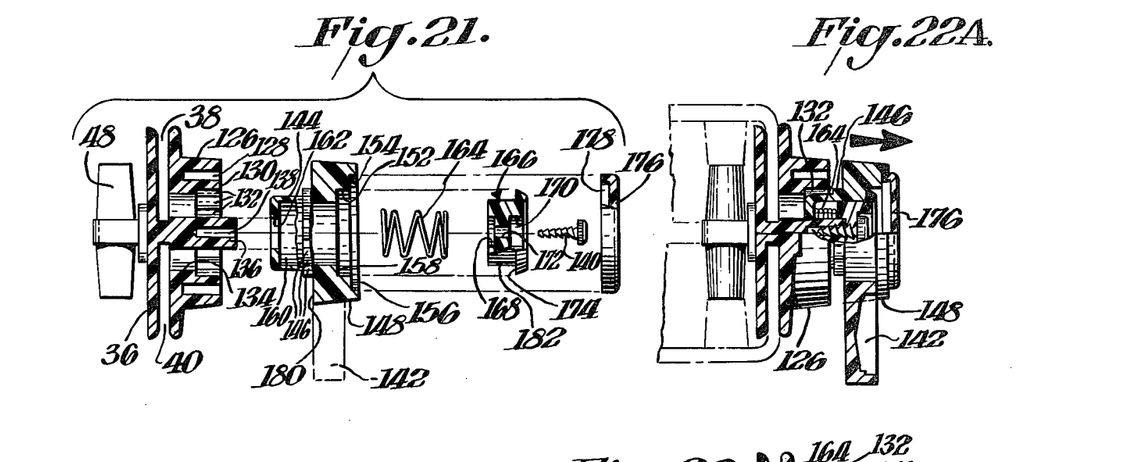
FIG. 21 is an assembly view partly in section of the handle adjustability and locking components for the handle structure shown in FIGS. 19-20.

Although various types of handle constructions can be used such as the known construction illustrated in FIGS. 17 and 18, a particularly advantageous feature of this invention is a novel spring loaded handle illustrated in FIGS. 19-22 which not only provides a positive lock but also permits adjustment without completely disengaging the handle. FIG. 21 illustrates the various components of this handle structure. On the outer surface of expander 36 an integral boss 126 is formed. An annular recess 128 defines the outer edge of socket 130. Locking formations 132 such as ratchet teeth or undulations are formed at the upper edge of socket 130 while the lower inner surface 134 is smooth. Extending from the center of socket 130 is an upstanding post 136 having an aperture 138 designed to receive screw 140. The inner surface of aperture 138 may be threaded or may be smooth using a diameter smaller than that of the diameter of screw 140. Post 136 functions not only as means of securement, as later described, but also as a centering post to assure rapid proper registration of the various elements during assembly. Handle 56 is U-shaped and made of a resilient material and terminates in a pair of free legs 142. Each leg has an inwardly directed tongue or extension 144 which has a smooth outer surface at its extreme end at about the same diameter or slightly smaller than the diameter of inner surface 134. An interlocking structure 146 is formed on projection 144 in a manner which complements or interlocks with formation 132 of socket 130. The length of locking formations 146 is less than that of formation 132. The outer end of leg 142 terminates in a slight boss 148 having a series of recesses 150, 152, 154 progressively decreasing in diameter forming shoulders 156, 158 and end wall 160. An aperture is formed in end wall 160 of a diameter slightly larger than post 136 so that the post can fit therethrough. The other locking components include spring 164 for fitting over post 136 and abutment or spring retainer 166. Retainer 166 has a recess 168 at its lead end of a diameter about the same as post 136 for very snugly fitting thereon. A recess 170 is formed in the opposite end thereof for receiving the head of screw 140 which extends through central aperture 172 of retainer 166. Shoulder 174 on retainer 166 is disposed for contacting shoulder 158 of handle end 142 as later described. The final element of the locking components for handle 56 is cap 176 made of a diameter to snugly fit in recess 154 against shoulder 156. The inner surface of cap 176 is likewise provided with a recess 178 for accommodating retainer 166.

FIG. 22 shows the handle structure in assembled condition. For assembling the handle structure legs 142 are spread apart so that the ends thereof with its locking structure may fit over boss 126 as the handle is brought into contact with the expanders 36. Post 136 slides through aperture 162 in the handle wall 160 to act as a guide for properly positioning the handle. Handle 56 is rotated to generally the desired orientation with projection 144 sliding toward inner surface 134 until the interlocking formations 132, 146 begin to contact. Very slight rotation may be necessary to properly register these locking formations and the handle is then snapped into place. Shoulder 180 and the end of leg or end 142 rests upon and leg 142 is generally of the same outer diameter as boss 126 so as to generally appear to form a continuous extension with shoulder 180 resting on the outer face of boss 126. Spring 164 is then telescoped over post 136 in recess 150 until spring 164 contacts wall 160. Retainer 166 is then placed over spring 164 with its cylindrical leading end 182 extending into recess 150. Retainer 166 is pushed or squeezed until internal shoulder 175 in recess 168 fits over post 136. Spring 164 is thus compressed being captured in a chamber formed by recessed handle end 142 and reacts against retainer 166 and end wall 160 urging handle end 142 toward expander 36 thereby assuring positive engagement between locking formations 146, 132. Screw 140 is then inserted through retainer 166 and screwed into outwardly extending post 136 to firmly lock the components in place. Cap 176 is then snapped into recess 154 and is so dimensioned as to be almost a press fit therein for shielding screw 140 with recess 178 of cap 176 fitting over retainer 166.

The spring biased lock afforded by this construction is a positive locking action vastly superior to the looser less positive locking formations of the prior art such as exemplified by FIGS. 17-18. By these prior arrangements for example if one were to pick up a casing by holding only one leg 120 of the handle the handle might become disengaged. This, however, is prevented by the arrangement of FIGS. 19-22.

The improved handle construction not only provides a more positive locking action but also permits adjustability in a simple and convenient meanner without detaching the handle securing means. FIG. 22A illustrates the handle structure during such adjustment. Handle ends 142 are pulled apart away from expanders 36. Since retainer 166 is screwed to post 136, retainer 166 is prevented from any movement and its shoulder 174 acts as a stop member when contacted by shoulder 158 of handle end 142 preventing any further outward movement of the handle ends. At this stage the components are in the position illustrated in FIG. 22A. Spring 164 is further compressed by the outwardly moving wall 160. Since cap 176 is mounted to handle end 142, cap 176 is displaced away from the outer surface of retainer 166. Locking formation 146 is moved out of engagement with corresponding locking formation 132 and smooth extension 144 is disposed at locking formation 132 without making any contact therewith. Since the locking formations are disengaged, the handle can be rotated to a new position and upon release thereof the handle snaps into the locking position illustrated in FIG. 22. As can be appreciated the only manipulations thus necessary to adjust the position of handle 56 is an outward pull and a rotation without the need to disengage or otherwise manipulate any of the securing elements such as removing cap 176 or unscrewing fastener 140. This handle construction thus represents a makred improvement over the prior art.

Figure 24:
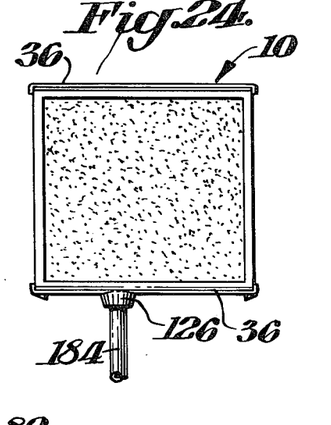
FIG. 24 is a front elevation view of an instrument housing mounted on a vertical support.

FIG. 24 represents another form of this invention wherein housing 10 is vertically mounted on its side. In this respect the upper expander 36 is of smooth outer surface without any boss or socket whereas lower expander 36 has a boss such as boss 126. A vertical post 184 is provided and may have a configuration generally similar to that on the end of handle leg 142 for locking interengagement with boss 126. Vertical post 184 may be secured to a support in any suitable manner. Obviously, other forms of securement of casing or housing 10 to post 184 may be practiced within the concepts of this invention.

Figure 25:
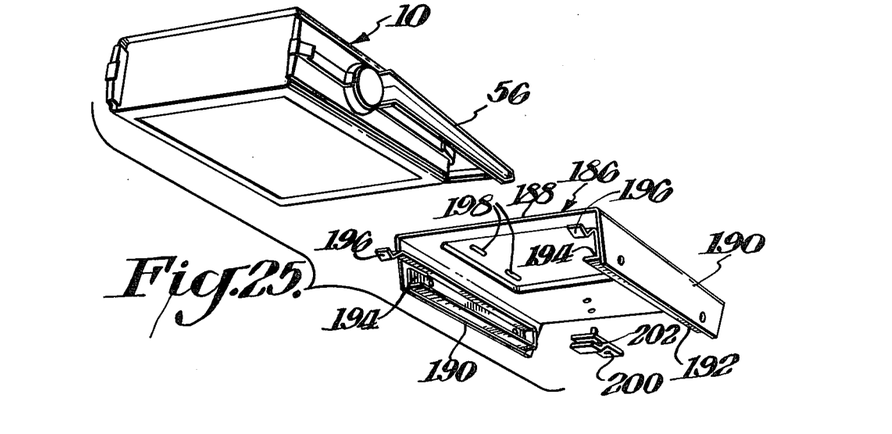
FIG. 25 is a pictorial assembly of an instrument housing in accordance with a further aspect of this invention.

FIG. 25 illustrates another embodiment of this invention which provides a means of mounting housing 10 in a fixed condition. As illustrated therein a frame 186 is provided which would be secured to a suitable support in any conventional manner. Frame 186 includes an intermediate wall 188 which spans opposite side walls 190. Guide means or rails 192 are mounted on each side wall and include channels 194 into which the sides or arms of handle 56 may be slid. The lead end of each guide 192 has a V-shaped detent 196 made of a springy material so that the handle would urge the detent upwardly until it has completely passed thereby and the detent 196 would then spring ownwardly to prevent accidental dislodgement of the casing or housing 10. The guide member 192 and particularly its detent 196 may be made of a suitable plastic material such as a polycarbonate having proper memory characteristics so that it will not lose its proper springiness. If preferred other spring biased means may be utilized.

In operation frame 186 would be mounted in place by, for example, conventional fasteners inserted through any number of spaced openings 198 in the intermediate wall 188. In certain applications it would be desirable to minimize any tendency of the housing to vibrate. To accomplish this a support block 200 may be attached in any suitable manner such as by threaded fasteners to the lower surface of intermediate wall 188. Support block 200 includes a bifurcated end defining a channel 202 into which the bight of handle 56 is slid to minimize vibration thereof.

The arrangement described with respect to FIG. 25 is paticularly advantageous not only in the particular type of mounting but also that the same mounting structure could be utilized for various type housings. Thus, for example, if a need arises to replace an existing housing with one which is higher or one which is shallower all that is necessary is to snap the old housing out of guides 192 beyond detents 196 and then insert a new housing having the same type of handle structure therein.

Figure 26:
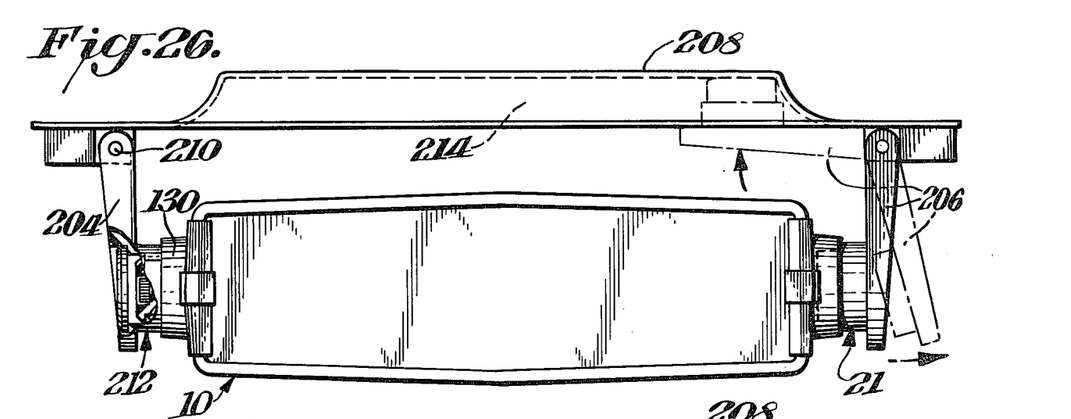
FIG. 26 is a front elevation view of an instrument housing in accordance with yet a further aspect of this invention.
Figure 27:
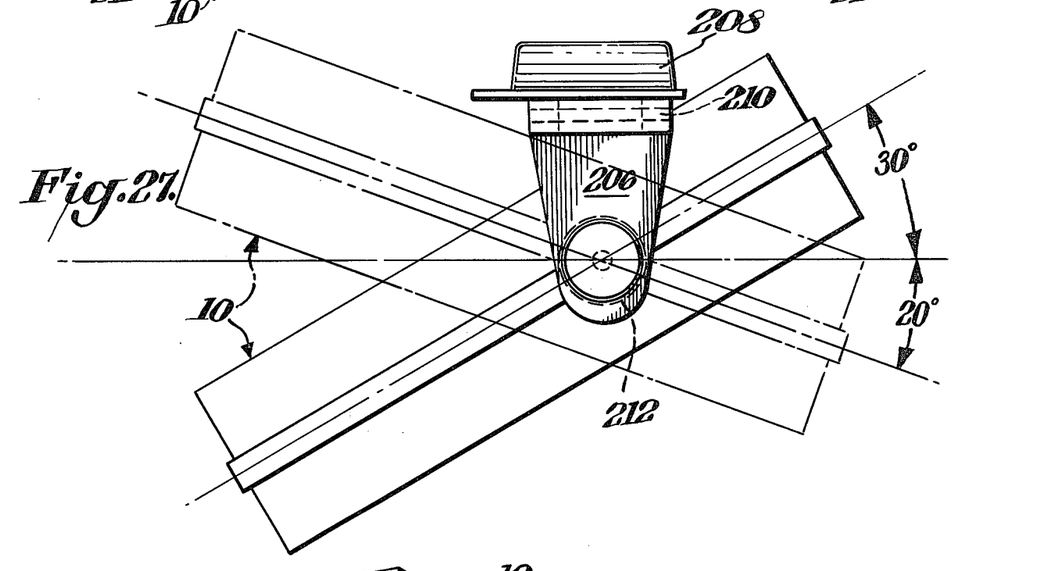
FIG. 27 is a side elevation view of the housing of FIG. 26 showing different orientations.

FIGS. 26-27 illustrate yet another embodiment of this invention which utilizes the concepts previously described above. In this arrangement the same housing and particularly its handle structure is utilized to provide a fixed supported mounting. Specifically, as illustrated therein a pair of hangers 206 are suspended from a support plate 208. Support plate 208 and its hangers 204, 206 may be considered as a form of U-shaped handle which, however, is fixedly mounted. Each hanger 204, 206 is pivotally mounted about pivot pin 210 at one end thereof, while the other end includes locking structure of the type described in FIGS. 21–22 for handle 56. This locking structure is schematically indicated by the reference numeral 212. Support plate 208 includes a cavity 214 so that in non-use hangers 204, 206 may be pivoted to a horizontal condition such as illustrated by the phantom lines for holder 206 with the locking structures 212 disposed within cavity 214 whereby the mounting arrangement thus occupies minimal space.

When it is desired to mount a housing 10 hangers 204, 206 are pivoted downwardly away from each other with at least one hanger being slightly off vertical as indicated by the phantom position of hanger 206. Housing 10 is then disposed in generally the desired angular orientation and because of the spacing between the hangers, the housing could be inserted therebetween. The interlocking structure on hanger 204 and housing 10 would be manipulated slightly, if necessary, to engage housing 10. Hanger 206 would then be pivoted to a vertical position and its locking structure 212 brought into engagement with socket 130 of housing 10 to firmly mount the housing in any orientation such as illustrated in phantom in FIG. 27. If preferred the firm mounting may be enchanced by biasing hangers 204, 206 upwardly toward plate 208 to prevent accidental dislodgement of housing 10. Similarly, it would be possible to practice the invention by, for example, mounting one of the hangers such as hanger 204 fixed or non-rotatable with the other hanger being spring biased. Obviously, other biasing means could be utilized as well as means for locking the hangers in their vertical position.

As can be appreciated the present invention lends itself to a countless variety of different uses by utilizing interchangeable components in such a manner that the same basic structures of molded components may be made by a manufacturer and then assembled in various manners in accordance with the needs of diverse ultimate users.

What is claimed is:

1. An instrument housing comprising a molded top wall, a molded bottom wall, a pair of opposed molded side walls slidably connected to said top wall and said bottom wall to form a hollow casing, fastening means securing said top wall to said bottom wall, vertical guide members having axial openings extending therethrough, said fastening means passing through said vertical guide members, horizontal flanges integral with said side walls, said guide members being molded to and extending from said flanges, and at least one of said flanges having a vertical opening whereby a support member may be disposed on said flanges and held in position by securing means placed in said opening.

2. The housing of claim 1 including a plurality of feet, each of said feet having a recessed outer end to form an inner wall, an axial aperture extending through said inner wall, said fastening means extending through said feet by passing through said axial opening and securing said feet to said bottom wall, and said feet shielding the exposed ends of said fastening means.

3. The housing of claim 2 wherein said top wall includes depressions in vertical alignment with said feet whereby the feet of another of the housings mounted thereon may be nested in said depressions.

4. The housing of claim 2 wherein each of top wall and said bottom wall is inwardly bowed, and said feet extending away from said bottom wall a distance greater than the extent of the inward bow of said top wall and said bottom wall whereby a plurality of the housings may be stacked atop each other.

5. The housing of claim 4 wherein said top wall includes depressions in vertical alignment with said feet whereby the feet of another of the housings mounted thereon may be nested in said depressions.

6. The housing of claim 1 wherein one of said side walls includes locking means disposed externally thereof, and a vertical post secured to said locking means for vertically mounting said housing on its side.

7. The housing of claim 1 including a U-shaped handle, and indexing means mounting said handle to said side walls for selective mounting in a plurality of different positions.

8. The housing of claim 7 wherein said indexing means includes a socket on each of said side walls, each of the free ends of said handle terminating in locking means, complementary locking means in each of said sockets, securing means mounting each of said ends to a respective of said sockets, and resilient means urging said locking means and said complementary locking means into locking engagement and permitting disengagement thereof without further manipulation of said securing means.

9. The housing of claim 7, in combination therewith, a frame including a pair of side walls connected to mounting structure, guide means on said side walls of said frame, and said housing being slid into said frame with said handle detachably secured to said guide means.

10. The housing of claim 8 wherein each of said sockets has a smooth inner surface over a portion thereof with said complementary locking means being on the remaining portion of said inner surface adjacent the outer edge of said socket, each of said free ends of said handle having an inwardly extending generally cylindrical projection terminating in a smooth outer surface with said locking means disposed inwardly thereof, said smooth outer surface being of lesser diameter than the inner diameter of said socket, said handle projection have an axial opening of stepped construction increasing in diameter away from said socket with an apertured end wall disposed toward said socket, said resilient means including a spring disposed in said projection against said end wall, a spring retainer having an axial opening extending completely therethrough, said spring retainer having an enlarged head on its outer end and an inwardly projecting generally cylindrical body and dimensioned for insertion into said projection to react against said spring for urging said handle toward said socket, said securing means comprising a fastener extending through said spring retainer and abutting thereagainst and extending through said projection and being secured to said socket to maintain said spring housed within said projection against said spring retainer, and said projection having an inner length outwardly from said end wall sufficiently long to permit said free end of said handle to be pulled away from said socket a sufficient distance to disengage said locking means from said complementary locking means whereby said handle may be rotated to a new position without adjusting said fastener.

11. The housing of claim 10 wherein a post is mounted in said socket and extends through said projection with said fastener being secured thereto, and said spring being mounted around said post.

12. The housing of claim 11 including a cover snapped into said projection, and said cover having a dished-out inner surface for accommodating said spring retainer and the remote end of said fastener.

13. The housing of claim 9 wherein said mounting structure comprises an intermediate wall spanning and connected to said side walls, a support block mounted to said intermediate wall, the bight of said handle being held in said support block to minimize vibration thereof, and V-shaped spring detents secured to the leading face of each said guide means for releasably locking said housing in said frame.

14. The housing of claim 8 wherein said U-shaped handle comprises a support plate with a pair of depending hangers suspended therefrom, said hangers being parallel with each other while engaging said sockets, and at least one of said hangers being movable away from the other of said hangers to permit engagement with said sockets.

15. The housing of claim 14 wherein each of said hangers is pivotally mounted, biasing means urging said hangers toward each other, and said support plate having an exposed cavity on its lower surface for receiving said locking means on said free ends whereby said hangers may be pivoted to an in line orientation against said support plate during periods of non-use.

16. The housing of claim 1 wherein said top wall is a keyboard unit.

17. The housing of claim 1 including a longitudinal extension secured to one end of said casing.

18. The housing of claim 1 wherein a pair of said flanges extend from each of said side walls at spaced locations thereof, one of said openings being in each of said flanges, a horizontal bridging member mounted upon and spanning said pair of flanges on one of said side walls, a second inverted horizontal bridging member mounted upon and spanning said pair of flanges on the opposite of said side walls, each of said bridging members having an aperture disposed over a corresponding of said openings of said flanges, and attaching means extending through said apertures and said openings for securing said bridging members to said flanges.

19. The housing of claim 18 wherein each of said bridging members in a rail adapter having aligned holes along its edge remote from its respective side wall.

20. The housing of claim 18 wherein each of said bridging members is a card slide adapter, a vertical wall connected to each of said bridging members remote from its respective flanges, and a plurality of parallel horizontal slots in each of said vertical walls exposed to the interior of said housing whereby cards may slide into respective slots in opposite of said vertical walls and supported thereby.

21. The housing of claim 1 wherein said top wall has internally threaded bosses mounted on its inner surface in line with said guide members, said bottom wall having apertured bosses on its inner surface in line with said guide members, and said fastening means being threaded fasteners extending through said bottom wall through a respective bottom wall boss and guide member and secured to a respective threaded boss.

22. The housing of claim 21 including spacers telescoped on at least some of said guide members for varying the height of said housing, and said spacers having axial openings through which said fasteners pass.

23. The housing of claim 22 including a detachable foot for each of said fasteners, each foot having a recessed outer end to form an inner wall, an axial aperture extending through said inner wall, each of said fasteners extending through a respective foot by passing through its said axial opening and securing said foot to said bottom wall, and said foot shielding the exposed end of said fastener.

24. The housing of claim 23 wherein the diameter of each of said fasteners is substantially smaller than the diameters of said foot apertures and said bottom wall boss apertures and said guide member openings and said spacer openings whereby said fasteners may be inserted therethrough at an angle and be threadably engaged in said top wall bosses, one end of said housing having a greater number of said spacers than the opposite end, and said housing having a greater height at said one end than said opposite end.

25. An instrument housing comprising a plurality of walls including a pair of opposite side walls, a U-shaped handle spanning said side walls, a socket on each of said side walls, each of the free ends of said handle terminating in locking means, complementary locking means in each of said sockets, securing means mounting each of said ends to a respective of said sockets, resilient means urging said locking means and said complementary locking means into locking engagement and permitting disengagement thereof without further manipulation of said securing means, each of said sockets having a smooth inner surface over a portion thereof with said complementary locking means being on the remaining portion of said inner surface adjacent the outer edge of said socket, each of said free ends of said handle having an inwardly extending generally cylindrical projection terminating in a smooth outer surface with said locking means disposed inwardly thereof, said smooth outer surface being of lesser diameter than the inner diameter of said socket, said handle projection having an axial opening of stepped construction increasing in diameter away from said socket with an apertured end wall disposed toward said socket, said resilient means including a spring disposed in said projection against said end wall, a spring retainer having an axial opening extending completely therethrough, said spring retainer having an enlarged head on its outer end and an inwardly projecting generally cylindrical body and dimensioned for insertion into said projection to react against said spring for urging said handle toward said socket, said securing means comrpising a fastener extending through said spring retainer and abutting thereagainst and extending through said projection and being secured to said socket to maintain said spring housed within said projection against said spring retainer, and said projection having an inner length outwardly from said end wall sufficiently long to permit said free end of said handle to be pulled away from said socket a sufficient distance to disengage said locking means from said complementary locking means whereby said handle may be rotated to a new position without adusting said fastener.

26. The housing of claim 25 wherein a post is mounted in said socket and extends through said projection with said fastener being secured thereto, and said spring being mounted around said post.

27. The housing of claim 26 including a cover snapped into said projection, and said cover having a dished-out inner surface for accommodating said spring retainer and the remote end of said fastener.

28. An instrument housing comprising a plurality of walls including a pair of opposite side walls, a U-shaped handle spanning said side walls, a socket on each of said side walls, each of the free ends of said handle terminating in locking means, complementary locking means in each of said sockets, securing means mounting each of said ends to a respective of said sockets, resilient means uring said locking means and said complementary locking means into locking engagement and permitting disengagement thereof without further manipulation of said securing means, in combination therewith, a frame including a pair of side walls connected to mounting structure, guide means on said side walls of said frame, and said housing being slid into said frame with said handle detachably secured to said guide means.

29. The housing of claim 28 wherein said mounting structure comprises an intermediate wall spanning and connected to said side walls, a support block mounted to said intermediate wall, the bight of said handle being held in said support block to minimize vibration thereof, and V-shaped spring detents secured to the leading face of each said guide means for releasably locking said housing in said frame.

30. An instrument housing comprising a plurality of walls including a pair of opposite side walls, a U-shaped handle spanning said side wall, a socket on each of said side walls, each of the free ends of said handle terminating in locking means, complementary locking means in each of said sockets, securing means mounting each of said ends to a respective of said sockets, resilient means urging said locking means and said complementary locking means into locking engagement and permitting disengagement thereof without further manipulation of said securing means, said U-shaped handle comprising a support plate with a pair of depending hangers suspended therefrom, said hangers being parallel with each other while engaging said sockets, at least one of said hangers being movable away from the other of said hangers to permit engagement with said sockets, each of said hangers being pivotally mounted, biasing means urging said hangers toward each other, and said support plate having an exposed cavity on its lower surface for receiving said locking means on said free ends whereby said hangers may be pivoted to a in line orientation against said support plate during periods of non-use.

31. The housing of claim 30 including a detachable foot for each of said fasteners, each foot having a recessed outer end to form an inner wall, an axial aperture extending through said inner wall, each of said fasteners extending through a respective foot by passing through its said axial opening and securing said foot to said bottom wall, and said foot shielding the exposed end of said fastener.

* * * * *

UNITED STATES PATENT AND TRADEMARK OFFICE
CERTIFICATE OF CORRECTION

PATENT NO. : 4,089,464
DATED : May 16, 1978
INVENTOR(S) : Joseph A. Teti et al

It is certified that error appears in the above-identified patent and that said Letters Patent are hereby corrected as shown below:

Col. 1, line 25, change "for" to -- of --

Col. 1, line 53, change "is" to -- its --

Col. 3, line 49, change "slide" to -- side --

Col. 4, line 56 to Col. 5, line 21, delete "orientations... feet 64"

Col. 7, line 34, change "ports" to -- posts --.

Col. 7, line 56, change "wherein" to -- therein --

Col. 8, line 16, change "formulation" to -- formation --

Col. 9, line 25, change "and" to -- at --

Col. 9, line 56, change "meanner" to -- manner --

Col. 10, line 13, change "makred" to -- marked --

UNITED STATES PATENT AND TRADEMARK OFFICE
CERTIFICATE OF CORRECTION

PATENT NO.  : 4,089,464
DATED       : May 16, 1978
INVENTOR(S) : Joseph A. Teti et al It is certified that error appears in the above-identified patent and that said Letters Patent are hereby corrected as shown below:

Col. 10, line 39, change "ownwardly" to -- outwardly --

Col. 10, line 58, change "paticularly" to -- particularly --

Col. 11, line 31, change "enchanced" to -- enhanced --

Col. 13, line 49, change "in" to -- is --

Col. 14, line 51, change "comrpising" to -- comprising --

Col. 14, line 61, change "adusting" to -- adjusting --

Col. 15, line 10, change "uring" to -- urging --

Col. 16, line 18, change "a" to -- an --

Signed and Sealed this

Twenty-sixth Day of December 1978

[SEAL]

Attest:

RUTH C. MASON
*Attesting Officer*

DONALD W. BANNER
*Commissioner of Patents and Trademarks*